(12) United States Patent
Carlson et al.

(10) Patent No.: US 10,620,608 B2
(45) Date of Patent: Apr. 14, 2020

(54) COLLET CONTRAST DISK

(71) Applicant: Raytheon Company, Waltham, MA (US)

(72) Inventors: Kristopher W. Carlson, Plano, TX (US); Christopher S. Bender, Plano, TX (US)

(73) Assignee: RAYTHEON COMPANY, Waltham, MA (US)

( * ) Notice: Subject to any disclaimer, the term of this patent is extended or adjusted under 35 U.S.C. 154(b) by 305 days.

(21) Appl. No.: 15/452,264

(22) Filed: Mar. 7, 2017

(65) Prior Publication Data

US 2018/0263147 A1   Sep. 13, 2018

(51) Int. Cl.
*G05B 19/29* (2006.01)
*H05K 13/08* (2006.01)

(52) U.S. Cl.
CPC ........ *G05B 19/29* (2013.01); *H05K 13/0812* (2018.08); *G05B 2219/45031* (2013.01)

(58) Field of Classification Search
CPC .......... G05B 19/29; G05B 2219/45031; H05K 13/0404; H05K 13/0408; H05K 13/0812
See application file for complete search history.

(56) References Cited

U.S. PATENT DOCUMENTS

| | | | |
|---|---|---|---|
| 4,628,464 A * | 12/1986 | McConnell | B25J 19/023 382/153 |
| 4,867,569 A * | 9/1989 | Mohara | H05K 13/0404 356/615 |
| 5,946,409 A * | 8/1999 | Hori | H01L 21/67271 348/126 |
| 6,160,906 A | 12/2000 | Lehnen et al. | |
| 6,211,958 B1 * | 4/2001 | Hachiya | H05K 13/0812 382/151 |
| 6,285,782 B1 * | 9/2001 | Inoue | H05K 13/0812 382/145 |
| 6,490,048 B1 | 12/2002 | Rudd et al. | |
| 6,744,499 B2 | 6/2004 | Skunes et al. | |
| 6,909,515 B2 | 6/2005 | Madsen et al. | |
| 7,545,514 B2 | 6/2009 | Manickam et al. | |
| 8,068,664 B2 | 11/2011 | Rudd et al. | |
| 2011/0102577 A1 | 5/2011 | Prakapenka et al. | |
| 2012/0062878 A1 | 3/2012 | Koshimura et al. | |
| 2014/0130348 A1 | 5/2014 | Okuda et al. | |
| 2014/0267682 A1 | 9/2014 | Youngquist | |
| 2018/0263147 A1 * | 9/2018 | Carlson | H05K 13/0408 |

FOREIGN PATENT DOCUMENTS

EP        0727934 A      8/1996

OTHER PUBLICATIONS

ISR/WO, Issued Jun. 6, 2018 RAY0361PCT, PCT Application No. PCT/US2018/020838, 17 pages total.

* cited by examiner

*Primary Examiner* — Minh N Trinh
(74) *Attorney, Agent, or Firm* — Cantor Colburn LLP

(57) ABSTRACT

A pick-and-place machine module is provided. The pick-and-place machine module includes a nozzle and a collet disk. The nozzle includes a body, a head and a tubular element extending between the body and the head such that the head is communicative with the body via the tubular element to enable a pick-up of a component by the head. The collet disk is affixed to a surface of the body facing the head about the tubular element and is configured to reflect light incident thereon toward an area of the base surrounding the component.

15 Claims, 3 Drawing Sheets

602  603  601

COLLET CONTRAST DISK

BACKGROUND

The present invention relates to a collet contrast disk and, more specifically, to a pick-and-place machine module provided with a collet contrast disk to improve pick-and-place capability and accuracy.

Surface mount technology (SMT) component placement systems are commonly called pick-and-place machines or P&Ps. Pick-and-place machines are robotic machines that are used to place surface-mount devices (SMDs) onto a printed circuit board (PCB) or for other similar actions where a small feature is picked up, moved and placed down onto another feature. In any case, they are often used for high speed, high precision placement of a broad range of electronic components, like capacitors, resistors and integrated circuits onto PCBs which are in turn used in computers and consumer electronics as well as industrial, medical, automotive, military and telecommunications equipment.

Pick-and-place machines typically have nozzles that use suction to lift a feature up off of a base and then hold that feature aloft. The nozzles are positioned optically and thus need to "see" or optically detect the feature to be lifted as well as the target. As such, in cases where the feature and the base the feature is lifted off of have similar coloring, the pick-and-place machines have difficulty "seeing" or optically detecting the feature and cannot reliably place the nozzles for suction and lifting. This situation is particularly true for cases where features to be lifted off of are a black components and the base they are lifted off of is also black or dark grey.

When pick-and-place machines cannot be used for reasons such as those described above, manual pick-and-placement is employed as a substitute and leads to misalignments due to human error and increased overall assembly times.

SUMMARY

According to one embodiment of the present invention, a pick-and-place machine module is provided. The pick-and-place machine module includes a nozzle and a collet disk. The nozzle includes a body, a head and a tubular element extending between the body and the head such that the head is communicative with the body via the tubular element to enable a pick-up of a component by the head. The collet disk is affixed to a surface of the body facing the head about the tubular element and is configured to reflect light incident thereon toward an area of the base surrounding the component.

According to another embodiment of the present invention, a pick-and-place machine module for picking a component up off a base is provided. The pick-and-place machine module includes a body configured for transmission of an attractive force, a head, a tubular element and a collet disk. The tubular element extends between the body and the head such that the head is communicative with the attractive force to enable a pick-up of the component by the head. The collet disk is affixed to a surface of the body facing the head about the tubular element and is configured to reflect light incident thereon toward an area of the base surrounding the component.

According to another embodiment of the present invention, a pick-and-place machine module for picking a component up off a base is provided. The pick-and-place machine module includes a body configured for transmission of suction, a head having opposing forward and aft faces and being formed to define a through-hole extending from the forward face, a tubular element and a collet disk. The tubular element extends between the body and the head such that the through-hole is communicative with the suction to enable a pick-up of the component by the forward face of the head. The collet disk is affixed to a forward facing surface of the body facing the aft face of the head about the tubular element and is configured to reflect light incident thereon toward an area of the base surrounding the component.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTIONS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
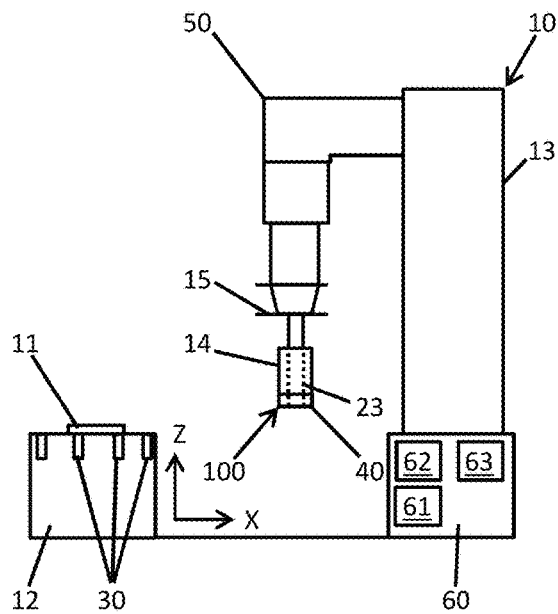
FIG. 1 is a side view of a pick-and-place machine in accordance with embodiments.

As will be described below, a nozzle body of a pick-and-place machine module or tool is provided with a collet disk. The collet disk serves to reflect light that is incident thereon or ambient light toward a base on which a component is disposed. This creates a halo-effect around the component which increases or improves the ability of the pick-and-place machine to optically detect or "see" the component for pick up procedures. As such, the use of the collet disk avoids the need to (as well as the associated costs with) manually position the pick-and-place machine for such component pick up procedures or the need to manually pick up the component directly.

With reference to FIGS. 1-4 and 6, a pick-and-place machine 10 is provided and is configured for picking a component 11 up off of a base 12. The pick-and-place machine 10 includes a machine fixture 13 that is configured to generate an attractive force, for example suction (for purposes of clarity and brevity, the following description will relate to the case in which the attractive force is suction although it is to be understood that other attractive forces, e.g., electro-magnetic and adhesive forces, are possible substitutes), a nozzle 14 and a collet disk 15.

The nozzle 14 includes a nozzle body 20 that is configured for transmission of the attractive force (e.g., suction) therethrough, a head 21 and a tubular element 22. The head 21 has a forwardly oriented face 210 and an aft oriented face 211, which is opposite the forwardly oriented face 210, and is formed to define a through-hole 23 that extends through the head 21 from the forwardly oriented face 210. The tubular element 22 extends between a forward facing surface 201 of the nozzle body 20 and the head 21 and forms a tubular pathway between the nozzle body 20 and the head 21. This tubular pathway is provided such that the through-hole 23 is communicative with the suction to enable a pick-up of the component 11 up off of the base 12 by contact between the forwardly oriented face 210 and a complementary face of the component 11.

In accordance with embodiments, the nozzle body 20 may have a frusto-conical shape with a narrowing taper with decreasing distance to the forward facing surface 201 and may include a flange 202 and an o-ring 203. The flange 202 is provided on the nozzle body 20 for handling and tooling purposes and the o-ring 203 is disposed to maintain a pressure seal with the machine fixture 13.

The nozzle body 20, the head 21, the tubular element 22 and the collet disk 15 cooperatively form a pick-and-place machine module 100 of the pick-and-place machine 10.

The collet disk 15 is configured to reflect at least a portion of light that is incident on the collet disk 15 toward an area of the base 12 that surrounds the component 11. The collet disk 15 includes a disk body 150 that has a first face 151 and a second face 152 opposite the first face 151. The first face 151 is affixed by adhesive or another similar fastening or adhesion tool to the forward facing surface 201 of the nozzle body 20 and the second face 152 faces the aft oriented face 211 of the head 21. The disk body 150 is disposed about the tubular element 22 and is formed to define an aperture 153 extending through the disk body 150 from the first face 151 to the second face 152. The aperture 153 is sized such that the collet disk 15 fits tightly or loosely about the tubular element 22.

In accordance with embodiments, the disk body 150 may have an annular shape and may have a similar or slightly smaller diameter than the flange 202. In addition, the disk body 150 may be provided as a substantially planarized or flat disk and may have with light coloring (e.g., white or yellow coloring) or specular coloration (e.g., silver coloring or mirrored).

Figure 2:
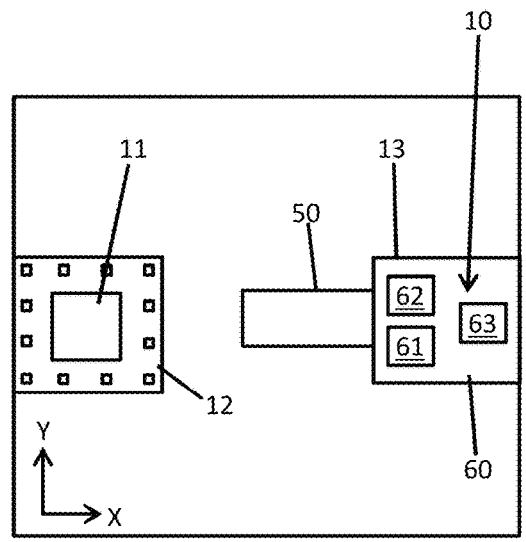
FIG. 2 is a top-down view of the pick-and-place machine of FIG. 1.
Figure 3:
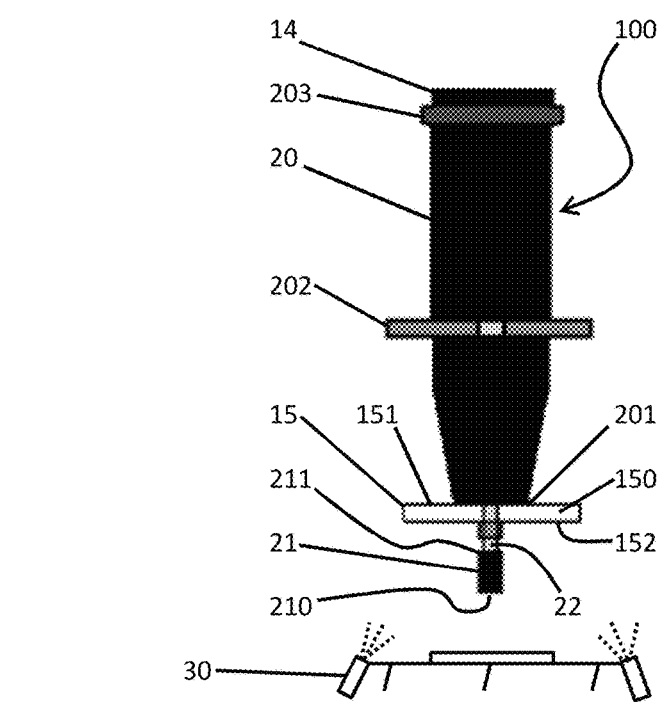
FIG. 3 is an enlarged view of a nozzle body and a collet disk of a pick-and-place machine module of the pick-and-place machine of FIG. 1.
Figure 4:
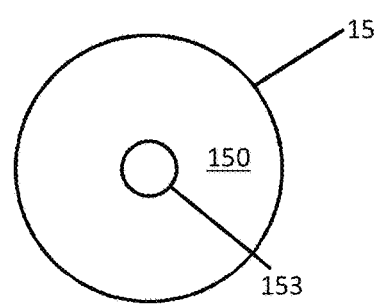
FIG. 4 is an axial view of the collet disk of FIG. 3.

As shown in FIGS. 1 and 2, the machine fixture 13 of the pick-and-place machine module 100 of the pick-and-place machine 10 includes a light source 30, an optical targeting mechanism 40, a servo mechanism 50 to which the nozzle body 20 is coupled and a controller 60. The light source 30 may be provided as one or more light sources 30 that is/are disposed at the base 12 about the component 11 to emit light to be incident on the collet disk 15 and thus reflected onto the area of the base 12 that surrounds the component 11. Additional light sources may also be provided around the machine fixture 13 to produce additional light along with ambient light. The optical targeting mechanism 40 may be provided as an optical sensor in the head 21 or another component with a clear line of sight to the component 11 or the base 12 and is configured to optically identify a three-dimensional location of the component 11 on the base 12 from the light reflected toward the area of the base 12 by the collet disk 15. The servo mechanism 50 may be provided as a robotic arm or gantry that is maneuverable in three dimensions and which has up to six degrees of freedom of movement such the servo mechanism 50 is configured to manipulate the nozzle body 20 in three dimensions (e.g., the z and x dimensions in FIG. 1 and the x and y dimensions in FIG. 2) so that the nozzle body 20 can be directed toward and down onto the component 11 and so that the nozzle body 20 can be directed upwardly from the base 12 while holding the component 11. The servo mechanism 50 may also be configured to generate the above-noted suction.

The controller 60 may be housed in or supported on the servo mechanism 50 as shown in FIG. 1 or may be remote from the servo mechanism 50. In any case, the controller 60 may include a processor 61, a memory unit 62 and a communication unit 63 by which the processor 61 is communicative with the optical targeting mechanism 40 and the servo mechanism 50. The memory unit 62 has executable instructions stored thereon, which, when executed, cause the processor 61 to perform the actions described herein. That is, the processor 61 is operably coupled to at least the optical targeting mechanism 40 and the servo mechanism 50 via the communication unit 63 and is thus receptive of information that is reflective of the three-dimensional location of the component 11 on the base 12 from the optical targeting mechanism 40 and is configured to control the various operations of the servo mechanism 50 in accordance with the information.

During operations of the pick-and-place machine 10 and the pick-and-place machine module 100 thereof, the optical targeting mechanism 40 optically detects the three-dimensional position of the component 11 on the base 12 and transmits information reflective thereof to processor 61 of the controller 60 via the communication unit 63. The processor 61 subsequently determines the three-dimensional location of the component 11 on the base 12 from the information and issues control commands to the servo mechanism 50 via the communication unit 63 that instruct the servo mechanism 50 to position the head 21 over the component 11 and then to lower the head 21 onto the component 11. At this point or prior to this point, the processor 61 activates the suction so that the head 21 can pick up the component 11 when the head 21 is lowered down onto the component 11. Finally, once the head 21 makes contact with the component 11 with suction, the processor 61 issues further control commands to the servo mechanism 50 via the communication unit 63 that instruct the servo mechanism 50 to raise the head 21 and to thereby lift the component 11 up off of the base 12.

Figure 5:
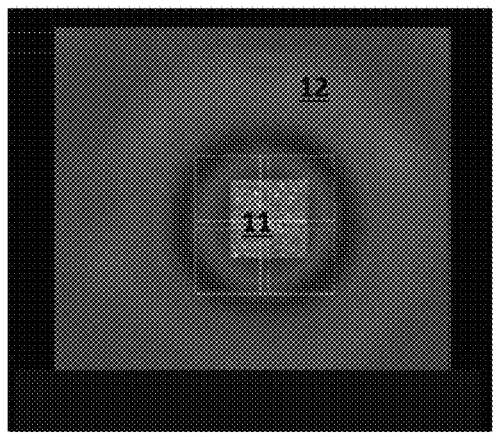
FIG. 5 is a graphical illustration of an optical reading of a component to be picked up by a pick-and-place machine module without a collet disk.
Figure 6:
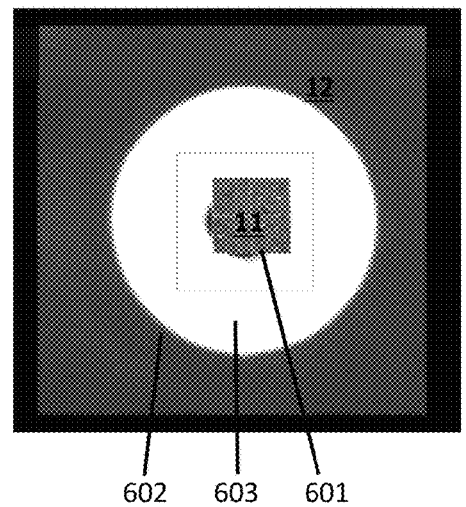
FIG. 6 is a graphical illustration of an optical reading of a component to be picked up by a pick-and-place machine module with a collet disk.

With reference to FIGS. 5 and 6, since the reliability of the movement of the servo mechanism 50 is based on the capability of the optical targeting mechanism 40 to optically detect the three-dimensional position of the component 11 on the base 12, it is important that the optical targeting mechanism 40 be able to clearly and easily optically detect the three-dimensional position of the component 11 on the base 12. However, as shown in FIG. 5, a conventional pick-and-place machine that does not include the above-described collet disk 15 may not be able to clearly and easily optically detect an exemplary component on an exemplary base. This is especially true if the coloring of the exemplary component and the exemplary base are similar.

By contrast, as shown in FIG. 6, the collet disk 15 of the pick-and-place machine module 100 of the pick-and-place machine 10 reflects light emitted by the light source 30 onto the area of the base 12 surrounding the component 11 and thus substantially increases a contrast between the imagery of the base 12 and the component 11. That is, the collet disk 15 creates a halo effect around the component 11 that is clearly and easily readable by the optical targeting mechanism 40 as a central dark region 601, an outer dark region 602 and an inner light region 603. The central dark region 601 corresponds to the component 11. The outer dark region 602 corresponds to the portion of the base 12 that is remote from the component 11. The inner light region 603 is radially interposed between the central dark region 601 and the outer dark region 602 and is significantly contrasted with both the central dark region 601 and the outer dark region 602.

Figure 7:
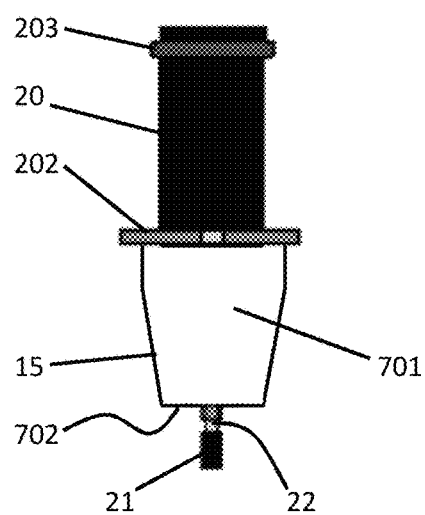
FIG. 7 is an enlarged view of a nozzle body and a collet disk in accordance with alternative embodiments.

In accordance with alternative embodiments and with reference to FIG. 7, the collet disk 15 may be provided as a covering 701 for the surface of the nozzle body 20 with light or specular coloration. Here, the covering 701 may be adhered or otherwise fastened to the nozzle body 20 and thus may have an external shape (e.g., a frusto-conical shape) that is similar to that of the nozzle body 20. With such a shape, at least the forward face 702 of the covering 701 will reflect light that is incident thereon toward the area of the base 12 that surrounds the component 11.

Figure 8:
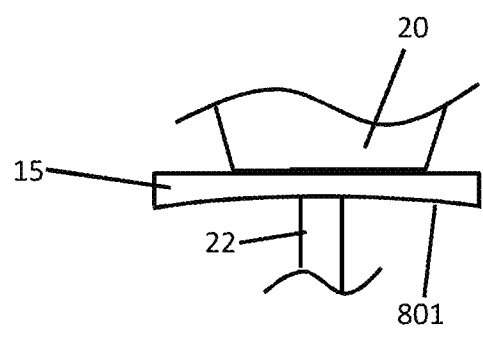
FIG. 8 is a side schematic view of a collet disk with a curved surface in accordance with further embodiments.
Figure 9:
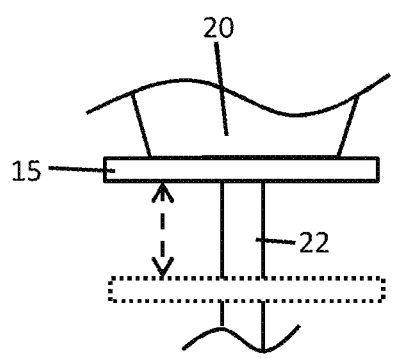
FIG. 9 is a side schematic view of a collet disk which is movable along a tubular element in accordance with further embodiments.
Figure 10:
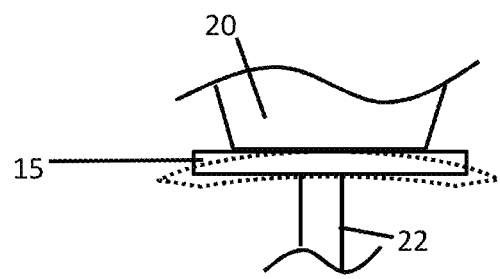
FIG. 10 is a side schematic view of a collet disk with shape changing capabilities in accordance with further embodiments.

In accordance with additional or further embodiments and with reference to FIGS. 8, 9 and 10, the collet disk 15 may be configured to focus the light that is reflected onto the area of the base 12 surrounding the component 11 so as to increase or decrease a sharpness of the contrast between the inner light region 603 with the central dark region 601 and the outer dark region 602. To this end, the collet disk 15 may include a curved surface 801 (see FIG. 8), may be movable along an axial length of the tubular element 22 (see FIG. 9) or may have a shape changing capability (see FIG. 10). Although drawn in FIG. 8 and FIG. 10 as a concave curvature, it is to be understood that the curved surface of collet disk 15 may also be convex in some cases where light from the light source 30 and ambient light are reflected toward the base 12. The movement of the collet disk 15 along the axial length of the tubular element 22 of FIG. 9 may be provided as a sliding or rotational/screwed movement whereby the collet disk 15 is manually or automatically positioned along the axial length to increase or decrease the halo effect. The shape changing capability may be provided in response to heating of the collet disk 15 or an application of voltage to the collet disk 15. Thus, the collet disk 15 may be made from materials that are designed to shape change in response to such stimuli (e.g., smart materials, piezo-electrics or as layered composite materials with different coefficients of thermal expansion).

It is to be understood that the embodiments of FIGS. 8-10 can be provided alone or in concert with one another or in concert with one or more of the embodiments described above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A pick-and-place machine for picking a component up off a base, the pick-and-place machine comprising:
   a pick-and-place machine module comprising:
      a body configured for transmission of suction;
      a head having opposing forward and aft faces and being formed to define a through-hole extending from the forward face;
      a tubular element extending between the body and the head by which the through-hole is communicative with the suction to enable a pick-up of the component by the forward face of the head; and
      a collet disk affixed to a forward facing surface of the body facing the aft face of the head about the tubular element and configured to reflect light incident thereon toward an area of the base surrounding the component,
   the pick-and-place machine further comprising:
      a light source disposed at the base about the component and configured to emit the light incident on the collet disk;
      an optical targeting mechanism configured to identify a three-dimensional location of the component on the base from the light reflected toward the area of the base by the collet disk;
      a servo mechanism coupled to the body and configured to manipulate the body in three-dimensions; and
      a controller which is receptive of information reflective of the three-dimensional location from the optical targeting mechanism and configured to control the servo mechanism in accordance with the information.

2. The pick-and-place machine according to claim 1, wherein the collet disk comprises a flat disk with light or specular coloration.

3. The pick-and-place machine according to claim 1, wherein the collet disk comprises a covering for the surface of the body with light or specular coloration.

4. The pick-and-place machine according to claim 1, wherein the collet disk comprises a curved surface.

5. The pick-and-place machine according to claim 1, wherein the collet disk is at least one of axially movable with respect to the body and shape changing to focus light onto the area of the base.

6. A pick-and-place machine for picking a component up off a base, the pick-and-place machine comprising:

a pick-and-place machine module comprising:
  a body configured for transmission of suction;
  a head having opposing forward and aft faces and being formed to define a through-hole extending from the forward face;
  a tubular element extending between the body and the head by which the through-hole is communicative with the suction to enable a pick-up of the component by the forward face of the head; and
  a collet disk affixed to a forward facing surface of the body facing the aft face of the head about the tubular element and configured to reflect light incident thereon toward an area of the base surrounding the component,
  wherein the collet disk comprises a curved surface.

7. The pick-and-place machine according to claim 6, further comprising:
  a light source disposed at the base about the component and configured to emit the light incident on the collet disk;
  an optical targeting mechanism configured to identify a three-dimensional location of the component on the base from the light reflected toward the area of the base by the collet disk;
  a servo mechanism coupled to the body and configured to manipulate the body in three-dimensions; and
  a controller which is receptive of information reflective of the three-dimensional location from the optical targeting mechanism and configured to control the servo mechanism in accordance with the information.

8. The pick-and-place machine according to claim 6, wherein the collet disk comprises a flat disk with light or specular coloration.

9. The pick-and-place machine according to claim 6, wherein the collet disk comprises a covering for the surface of the body with light or specular coloration.

10. The pick-and-place machine according to claim 6, wherein the collet disk is at least one of axially movable with respect to the body and shape changing to focus light onto the area of the base.

11. A pick-and-place machine for picking a component up off a base, the pick-and-place machine comprising:
  a pick-and-place machine module comprising:
    a body configured for transmission of suction;
    a head having opposing forward and aft faces and being formed to define a through-hole extending from the forward face;
    a tubular element extending between the body and the head by which the through-hole is communicative with the suction to enable a pick-up of the component by the forward face of the head; and
    a collet disk affixed to a forward facing surface of the body facing the aft face of the head about the tubular element and configured to reflect light incident thereon toward an area of the base surrounding the component,
    wherein the collet disk is at least one of axially movable with respect to the body and shape changing to focus light onto the area of the base.

12. The pick-and-place machine according to claim 11, further comprising:
  a light source disposed at the base about the component and configured to emit the light incident on the collet disk;
  an optical targeting mechanism configured to identify a three-dimensional location of the component on the base from the light reflected toward the area of the base by the collet disk;
  a servo mechanism coupled to the body and configured to manipulate the body in three-dimensions; and
  a controller which is receptive of information reflective of the three-dimensional location from the optical targeting mechanism and configured to control the servo mechanism in accordance with the information.

13. The pick-and-place machine according to claim 11, wherein the collet disk comprises a flat disk with light or specular coloration.

14. The pick-and-place machine according to claim 11, wherein the collet disk comprises a covering for the surface of the body with light or specular coloration.

15. The pick-and-place machine according to claim 11, wherein the collet disk comprises a curved surface.

* * * * *